United States Patent [19]
Yamada

[11] Patent Number: 4,780,853
[45] Date of Patent: Oct. 25, 1988

[54] MEMORY DEVICE
[75] Inventor: Yasumasa Yamada, Tokyo, Japan
[73] Assignee: NEC Corporation, Tokyo, Japan
[21] Appl. No.: 918,179
[22] Filed: Oct. 14, 1986
[30] Foreign Application Priority Data
  Oct. 17, 1985 [JP] Japan .................. 60-232706
[51] Int. Cl.$^4$ ............................. G11C 13/00
[52] U.S. Cl. .................... 365/207; 365/189
[58] Field of Search ............. 365/207, 189, 230

[56] References Cited
U.S. PATENT DOCUMENTS
  3,969,706  7/1976  Proebsting et al. ............. 365/207
  4,613,957  9/1986  Iwahashi et al. ............... 365/207

Primary Examiner—Terrell W. Fears
Attorney, Agent, or Firm—Sughrue, Mion, Zinn, Macpeak & Seas

[57] ABSTRACT

For improvement of access time, there is disclosed a memory device comprising a plurality of memory cells each having first and second output nodes on which voltages with a slightly difference therebetween appear based on a bit of data stored in the memory cell when the memory cell is selected, a plurality of sense amplifiers one of which is activated to amplify the difference between said voltages appearing on the first and second output nodes of a selected memory cell and the others of which remain inactive condition, each of said sense amplifiers having first and second output nodes on which voltages with large difference therebetween appear when the sense amplifier is activated, and a logic circuit having first and second groups of input nodes electrically connected to the first and second output nodes of said sense amplifiers, respectively, and operative to supply first and second output nodes thereof with voltages relating to the voltages appearing on the first and second output nodes of said activated sense amplifier based on a logical operation thereof.

8 Claims, 4 Drawing Sheets

MEMORY DEVICE

FIELD OF THE INVENTION

This invention relates to a memory device and, more particularly, to a memory device with an improved access time.

BACKGROUND OF THE INVENTION

A memory device fabricated on a semiconductor chip has a plurality of sense amplifiers each designed to detect a slight difference between the potentials on two mutually associated bit lines connected to a plurality of memory cells which form parts of a memory array. Such a differential voltage appearing on the two bit lines is detected upon amplification by the sense amplifier. The two bit lines may consist of a mutually complementary bit lines. The amplified differential voltage is transferred to an output circuit for determination of a bit of data based on the transferred differential voltage.

However, a certain memory device of the type having a plurality of sense amplifiers electrically connected by a pair of shared output lines to the output circuit has a problem in that a current path is liable to be established between the shared output lines through an inactivated sense amplifier during amplification by an activated sense amplifier and, for this reason, the time duration necessary for access to a memory cell tends to be prolonged.

It is therefore a prime object of the present invention to provide an improved memory device which is free from the current path established between the shared output lines during each of the read cycles.

SUMMARY OF THE INVENTION

In accordance with the present invention, there is provided a memory device comprising (a) a plurality of memory cells each having first and second output nodes on which voltages with a slightly difference therebetween appear based on a bit of data stored in the memory cell when the memory cell is selected, (b) a plurality of sense amplifiers one of which is activated to amplify the difference between the voltages appearing on the first and second output nodes of a selected memory cell and the others of which remain inactive condition, each of the sense amplifiers having first and second output nodes on which voltages with large difference therebetween appear when the sense amplifier is activated, and (c) a logic circuit having first and second groups of input nodes electrically connected to the first and second output nodes of the sense amplifiers, respectively, and operative to supply first and second output nodes thereof with voltages relating to the voltages appearing on the first and second output nodes of the activated sense amplifier based on a logical operation thereof.

BRIEF DESCRIPTION OF THE DRAWINGS

The drawbacks of a prior-art memory device and the features and advantages of a memory device according to the present invention will be more clearly understood from the following description taken in conjunction with the accompanying drawings in which like reference numerals designate similar or corresponding circuits and elements and in which.

DESCRIPTION OF THE PRIOR-ART

Figure 1:
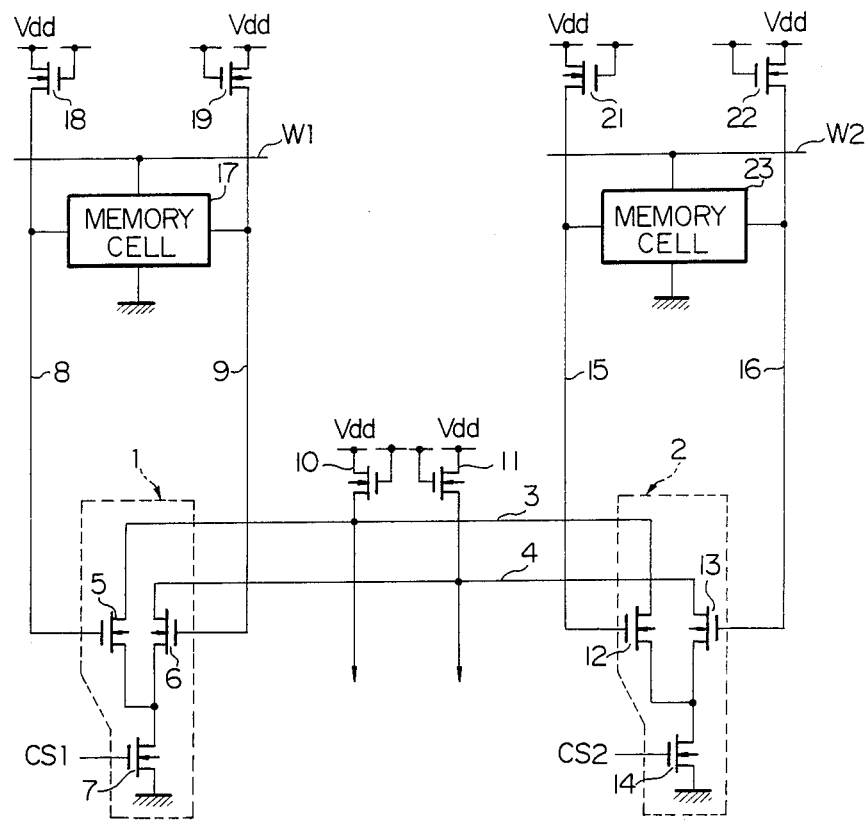
FIG. 1 is a circuit diagram showing a part of the circuit arrangement of a representative example of a prior-art memory device.

In FIG. 1 of the drawings, there is shown a part of a known memory device of the type having a plurality of sense amplifiers 1 and 2 electrically connected by a pair of shared output lines 3 and 4. The sense amplifier 1 comprises a pair of amplifier transistors 5 and 6 and an activating transistor 7. The amplifier transistors 5 and 6 have respective gate electrodes connected to a pair of bit lines 8 and 9, respective source nodes connected to the shared output lines 3 and 4, and respective drain nodes commonly connected to a drain node of the activating transistor 7. The activating transistor 7 further has a grounded source node and a gate electrode applicable with a selecting signal CS1. The shared output lines 3 and 4 are supplied with a positive voltage Vdd' slightly lower than that of the voltage source Vdd through a pair of load transistors 10 and 11. The sense amplifier 2 has similar in circuit arrangement to the sense amplifier 1 and, for this reason, reference numerals 12, 13, 14, 15, 16 and CS2 are used for designation of corresponding components and a signal to the above mentioned transistors 5, 6, and 7, the bit lines 8 and 9 and the signal CS1 without detailed description.

The bit lines 8 and 9 are supplied with the positive voltage Vdd' through load transistors 18 and 19, respectively, and electrically connected to a plurality of memory cells one of which is designated by reference numeral 17. The bit lines 15 and 16 are also supplied with the positive voltage Vdd' through load transistors 21 and 22, respectively, and electrically connected to a plurality of memory cells one of which is designated by reference numeral 23.

Figure 2:
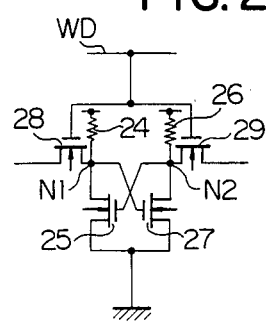
FIG. 2 is a circuit diagram showing the circuit arrangement of a static memory cell incorporated in both the prior-art memory device and a preferred embodiment of a memory device according to the present invention.

A typical example of the static memory cell is shown in FIG. 2 and comprises a series combination of a load resistor 24 and a transistor 25 provided between the voltage source Vdd and the ground, a series combination of a load resistor 26 and a transistor 27 arranged in parallel with the above mentioned series combination, and a gate transistors 28 and 29. The static memory cell has a pair of information storage nodes N1 and N2 which are provided between the load resistors 24 and 26 and the transistors 25 and 27, respectively, and cross coupled with gate electrodes of the transistors 27 and 25, respectively. The gate transistors 28 and 29 are gated by a word line WD and operative to establish or block the electrical communication between the bit lines and the information storage nodes N1 and N2, respectively, depending upon the voltage level of the word line WD. The static memory cell thus arranged is available to store a bit of data in the form of a differential voltage between the information nodes N1 and N2 and further operative to transfer the differential voltage between the information nodes N1 and N2 to the bit lines.

Each of the memory cells 17 and 29 is identical in circuit arrangement with the static memory cell shown in FIG. 2, so that the memory cell 17 or 23 is gated by a word line W1 or W2, and a bit of data is readably stored in the form of differential voltage between the information nodes of the memory cell 17 or 23.

Assuming now that all of the transistors shown in FIG. 1 are formed by n-channel field-effect transistors and that the bit lines 8 and 9 have positive voltages V1 and V2 of high and low levels, respectively, when the word line W1 goes up for allowing an external device to access the bit of data stored in the memory cell 17. In the initial stage, the positive voltages V1 and V2 on the bit lines merely have a slight difference and are applied to the respective gate electrodes of the amplifier transistors 5 and 6. When the selecting signal CS1 goes up for actuation of the activating transistor 7, the amplifier transistor 5 turns on with a large channel conductance, however the amplifier transistor 6 turns on with a small channel conductance which decreases with time, thereby putting a differential voltage with a large difference on the output lines 3 and 4.

When the memory cell 17 is selected, the word line W2 remains in low level. The word line W2 thus remaining in low level causes the bit lines 15 and 16 to have the positive voltage level Vdd' which is applied to the gate electrodes of the amplifier transistors 12 and 13 forming part of the inactivated sense amplifier 2 with the low selecting signal CS2. This situation results in undesired on-conditions of amplifier transistors 12 and 13. Namely, when the amplifier transistors 5 and 6 turn on with the respective channel conductance, the voltage levels of the output lines 3 and 4 go down with different speeds, respectively, and, for this reason, the shared output lines 3 and 4 have respective voltage levels exceeding the threshold voltages of the amplifier transistors 12 and 13, successively. When the amplifier transistors 12 and 13 have the concurrent on-conditions, an electric path is established between the shared output lines 3 and 4 across the amplifier transistors 12 and 13, and, for this reason, the sense amplifier 1 needs a long period of time for amplification.

DETAILED DESCRIPTION OF THE PREFERRED EMBODIMENTS

Figure 3:
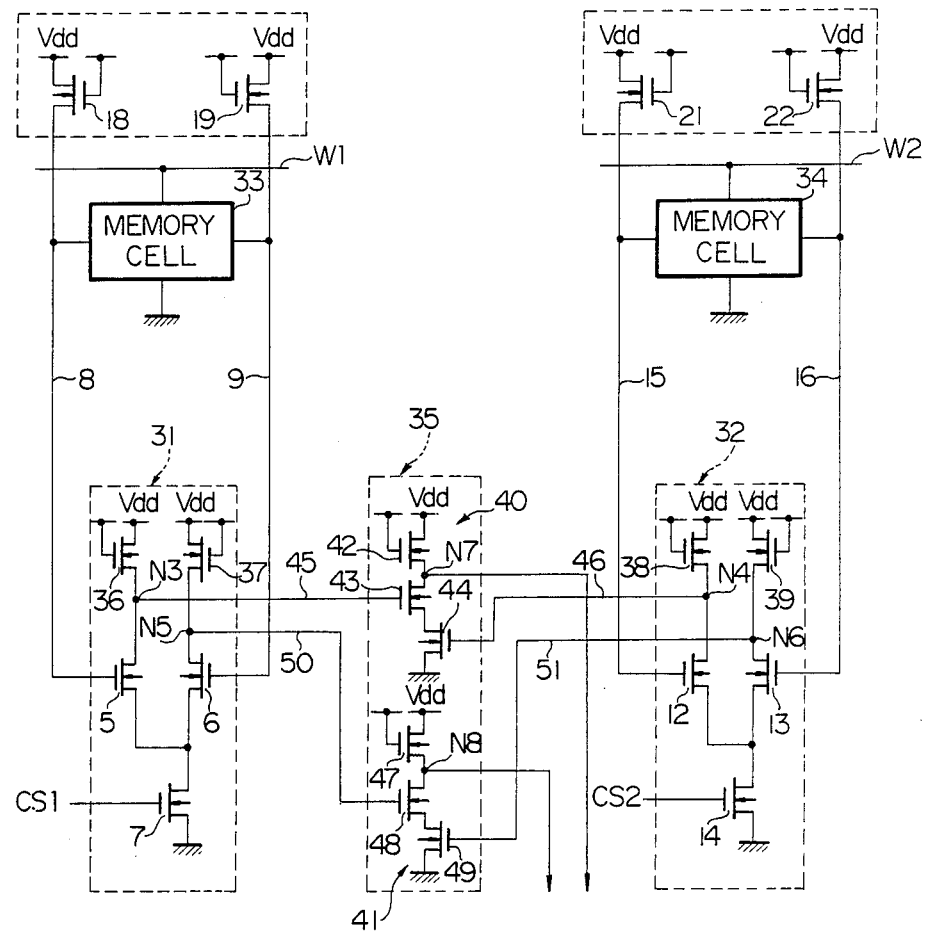
FIG. 3 is a circuit diagram showing a part of the circuit arrangement of a preferred embodiment of a memory device according to the present invention.

Referring now to FIG. 3 of the drawings, there is shown a part of a preferred embodiment of a memory device which largely comprises a plurality of sense amplifiers 31 and 32, memory cells 33 and 34, and a logic circuit 35. Each of the memory cells 33 and 34 is identical in circuit arrangement with the static memory cell illustrated in FIG. 2. Each of the sense amplifiers 31 and 32 only differs from the prior-art sense amplifier 1 or 2, in preparation of load transistors 36 and 37, or 38 and 39 exclusively used therefor. The load transistors 36 and 37 are provided between the voltage source Vdd and the amplifier transistors 5 and 6 and supply the respective source nodes of the amplifier transistors 5 and 6 with the positive voltage Vdd'. The load transistors 38 and 39 are also provided between the voltage source and the respective source nodes of the amplifier transistors 12 and 13, supplying the source nodes of the amplifier transistors 12 and 13 with the positive voltage Vdd'. The source nodes of the transistors 5 and 12 serve as first output nodes N3 and N4 of the sense amplifiers 31 and 32, respectively, on the other hand, the source nodes of the transistors 6 and 13 serve as second output nodes N5 and N6 of the sense amplifiers 31 and 32.

In this instance, the logic circuit 35 comprises two NAND circuits 40 and 41. The NAND circuit 40 comprises a series combination of n-channel field effect transistors 42, 43 and 44 provided between the voltage source Vdd and the ground. The transistor 42 serves as a load transistor supplying an output node N7 with the positive voltage Vdd', but the transistors 43 and 44 have respective gate electrodes electrically connected to the first output nodes N3 and N4 of the sense amplifiers 31 and 32 through output lines 45 and 46. The NAND circuit 40 thus arranged can provide a NAND operation based on the voltage levels on the first output nodes N3 and N4 of the sense amplifiers 31 and 32. Similarly, the NAND circuit 41 comprises a series combination of n-channel field effect transistors 47, 48 and 49 provided between the voltage source Vdd and the ground. The transistor 47 serves as a load transistor supplying an output node N8 with the positive voltage Vdd', but the transistors 48 and 49 have respective gate electrodes electrically connected to the second output nodes N5 and N6 of the sense amplifiers 31 and 32 through output lines 50 and 51. The NAND circuit 41 thus arranged can provide a NAND operation based on the voltage levels on the second output nodes N5 and N6 of the sense amplifiers 31 and 32.

An operation of the preferred embodiment will be described hereinunder on the assumption that the positive voltages V1 and V2 with a slight difference appear upon access to the bit of data stored in the memory cell 17. According to the above assumption, the word line W2 remains in low level, and the bit lines 15 and 16 have gone up to the positive voltage level Vdd' slightly lower than that of the voltage source Vdd. When the selecting signal CS1 goes up for actuation of the activating transistor 7, the amplifier transistors 5 and 6 turn on with different channel conductances from each other, and the first and second output nodes N3 and N5 go down with different speeds in order to amplify the differential voltage between the bit lines 8 and 9. The bit line 8 has the higher voltage level V1 than the bit line 9, so that the amplifier transistor 5 turns on with a channel conductance larger than that of the amplifier transistor 6. As a result, the output node N3 has a voltage level lower than that of the output node N5. The output node N3 with the lower voltage level allows the n-channel transistor 43 to remain in off-condition, but the output node N5 with the higher voltage level causes the n-channel transistor 48 to turn on. The NAND circuit 40 thus supplied with the lower voltage level from the output node N3 provides a higher voltage level on the output node N7 thereof even if the positive high voltage Vdd' is supplied to the transistor 44. On the other hand, the NAND circuit 41 provides a lower voltage level on the output node N8 based on the high voltage levels concurrently appearing on the second output nodes N5 and N6 of the sense amplifiers 31 and 32.

Figure 4:
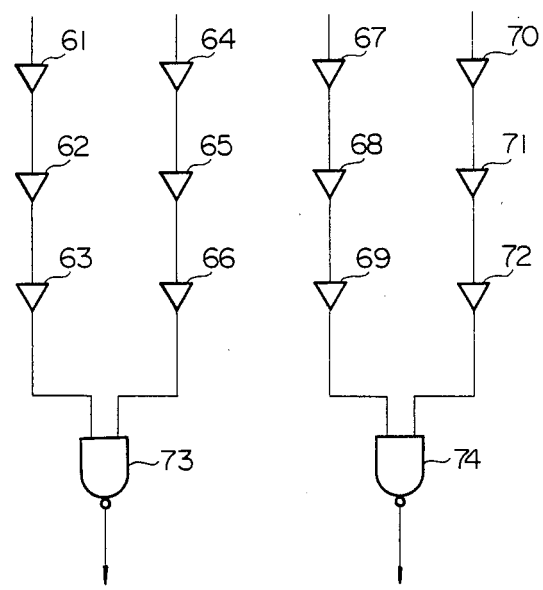
FIG. 4 is a logic diagram showing a modification of the memory device shown in FIG. 3.

Turning to FIG. 4 of the drawings, there is shown a part of a modification of the memory device which has a multiple sense amplifier circuits. Though not shown in FIG. 4, a series of sense amplifiers 61, 62 and 63 are provided for one of paired bit lines corresponding to the bit line 8, and a series of sense amplifiers 64, 65 and 66 are provided for one of the paired bit lines corresponding to the bit line 15. Likewise, a series of sense amplifiers 67, 68 and 69 are provided for the other of the paired bit lines corresponding to the bit line 9, and a series of sense amplifiers 70, 71 and 72 are provided for the other of the paired bit lines corresponding to the bit line 16.

The sense amplifiers 63 and 66 and the sense amplifiers 69 and 72 are supplied to input nodes of NAND circuits 73 and 74 with respective output voltage levels, and, for this reason, a pair of mutually complementary voltage levels with a large difference take place on output nodes of the NAND circuits 73 and 74 without any interference to the activated sense amplifier.

Figure 5:
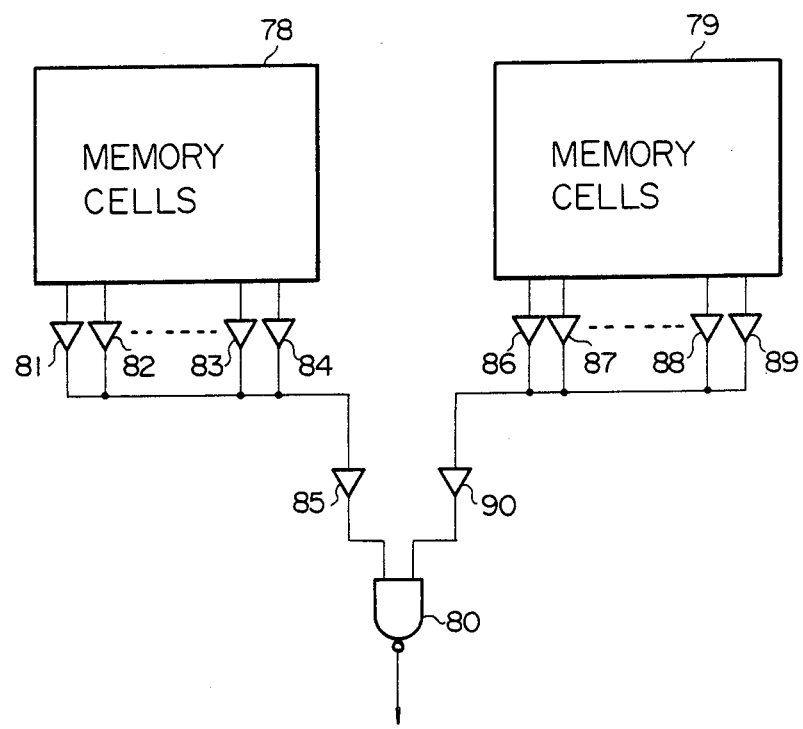
FIG. 5 is a logic diagram showing another modification of the memory device shown in FIG. 3.

In FIG. 5 is shown another modification of the memory device with a plurality of bits in length. The bits read from respective memory cells 78 and 79 are transferred to a NAND circuit 80 through sense amplifiers 81 to 90.

The preferred embodiment comprises a plurality of n-channel field effect transistors, but it is possible to form the memory device with a plurality of p-channel field effect transistors.

As will be understood from the above description, the sense amplifiers incorporated in the memory device are perfectly separated from each another by the logic circuit, and, for this reason, no current path is established between the output lines of each sense amplifier. This perfect separation is conducive to rapid amplification by the sense amplifiers, thereby reducing an access time to the bit of data stored in the memory cell.

What is claimed is:

1. A memory device comprising:
   (a) a plurality of memory cells each having first and second output nodes on which voltages with a slightly difference therebetween appear based on a bit of data stored in the memory cell when the memory cell is selected.
   (b) a plurality of sense amplifiers one of which is activated to amplify the difference between said voltages appearing on the first and second output nodes of a selected memory cell and the others of which remain inactive condition, each of said sense amplifiers having first and second output nodes on which voltages with large differences therebetween appear when the sense amplifier is activated;
   (c) a logic circuit having first and second groups of input nodes electrically connected to the first and second output nodes of said sense amplifiers, respectively, and operative to supply first and second output nodes thereof with voltages relating to the voltages appearing on the first and second output nodes of said activated sense amplifier based on a logical operation thereof, and
   (d) wherein each of said amplifiers comprises a series combination of a first load transistor and a first amplifier transistor provided between sources of voltage of high and low levels, a series combination of a second load transistor and a second amplifier transistor provided between the sources of the voltages of high and low levels, and an activating transistor provided in association with the first and second amplifier transistors for activating each of the first and second amplifier transistors when the activating transistor is actuated, said first and second amplifier transistor is actuated, said first and second amplifier transistors having control nodes electrically connected to the first and second output nodes of said memory cell, respectively, said first and second output nodes of the sense amplifier being provided between said first and second load transistors and said first and second amplifier transistors, respectively.

2. A memory device as set forth in claim 1, in which said each of said first and second load transistors, said first and second amplifier transistors and said activating transistor is formed with an n-type field effect transistor.

3. A memory device as set forth in claim 2, in which said logic circuit comprises first and second NAND circuits the former of which has a plurality of input nodes electrically connected to the first output nodes of said sense amplifiers, respectively and the latter of which has a plurality of input nodes electrically connected to the second output nodes of said sense amplifiers, respectively.

4. A memory device as set forth in claim 3, in which each of said first and second NAND circuits comprises a series of field effect transistors provided between the sources of the voltages of the high and low levels and having control nodes serving as said first or second group of input nodes, said first or second output node of said logic circuit being provided between the series of field effect transistors and the source of the voltage of the high level.

5. A memory device comprising
   (a) a plurality of static memory cells each having first and second output nodes on which voltages with a slightly difference therebetween appear based on a bit of data stored in the memory cell when the memory cell is selected,
   (b) a plurality of sense amplifiers one of which is activated to amplify the difference between said voltages appearing on the first and second output nodes of a selected memory cell and the others of which remain inactive condition, each of said sense amplifiers comprising a first series combination of an n-channel load transistor and an n-channel amplifier transistor provided between sources of voltage of high and low levels, a second series combination of an n-channel load transistor and an n-channel amplifier transistor provided between the sources of voltage of high and low levels and first and second output nodes provided between the n-channel field effect transistors and the n-channel amplifier transistors, respectively, voltages with large difference therebetween appearing on said first and second output nodes of each of said sense amplifiers based on the voltages appearing on the first and second output nodes of said selected memory cell when the sense amplifier is activated; and
   (c) a logic circuit having first and second NAND circuits each provided with a plurality of n-channel field effect transistors, the n-channel field effect transistors of the first NAND circuit having respective gate electrodes electrically connected to the first output nodes of said sense amplifiers, respectively, the n-channel field effect transistors of the second NAND circuit having respective gate electrodes electrically connected to the second output nodes of said sense amplifiers, respectively, said logic circuit being operative to supply first and second output nodes thereof with voltages relating to the voltages appearing on the first and second output nodes of said activated sense amplifier.

6. A memory device comprising:
   (a) a plurality of memory cells each having first and second output nodes on which voltages with a slight difference therebetween appear based on a bit of data stored in the memory cell when the memory cell is selected,
   (b) a plurality of sense amplifiers one of which is activated to amplify the difference between said voltages appearing on the first and second output nodes of a selected memory cell and the others of which remain in an inactive condition, each of said sense amplifiers having an output node, the output nodes of the inactivated sense amplifiers assuming a first level, the output node of the activated sense amplifier assuming one of said first level and a second level in accordance with data stored in the selected memory cell associated thereto, and (c) a logic circuit having a plurality of input nodes electrically isolated from each other, each of said input nodes being connected to the output node of each one of said sense amplifiers, said logic circuit producing an output signal corresponding to the level of the output node of said activated sense amplifier when the remaining input nodes are supplied with said first level.

7. A memory device as set forth in claim 6, in which said logic circuit comprises a NAND circuit.

8. A memory device comprising:
(a) a plurality of static memory cells each having first and second output nodes on which voltages with a slight difference therebetween appear based on a bit of data stored in the memory cell when the memory cell is selected,
(b) a plurality of differential sense amplifiers one of which is activated to amplify the difference between said voltages appearing on the first and second output nodes of a selected memory cell and the others of which remain in an inactive condition, each of said sense amplifiers comprising a first series combination of a first transistor and a second transistor provided between sources of voltage of high and low levels, a second series combination of a third transistor and a fourth transistor provided between the sources of voltage of high and low levels and first and second output nodes provided at intermediate junctions of said first and second series combinations, respectively, voltages with a large difference therebetween appearing on said first and second output nodes of each of said sense amplifiers based on the voltages appearing on the first and second output nodes of said selected memory cell when the sense amplifier is activated, and
(c) a logic circuit having first and second NAND circuits each provided with a plurality of n-channel field effect transistors, the n-channel field effect transistors of the first and NAND circuit having respective gate electrodes electrically connected to the first output nodes of said sense amplifiers, respectively, the n-channel field effect transistors of the second NAND circuit having respective gate electrodes electrically connected to the second output nodes of said sense amplifiers, respectively, said logic circuit being operative to supply first and second output nodes thereof with voltages relating to the voltages appearing on the first and second output nodes of said activated sense amplifier.

* * * * *